United States Patent
Wada et al.

(10) Patent No.: US 10,164,585 B2
(45) Date of Patent: Dec. 25, 2018

(54) RADIO FREQUENCY FILTER, RADIO FREQUENCY FRONT-END CIRCUIT, COMMUNICATION DEVICE, AND DESIGN METHOD FOR RADIO FREQUENCY FILTER

(71) Applicant: Murata Manufacturing Co., Ltd., Kyoto (JP)

(72) Inventors: Takaya Wada, Kyoto (JP); Reiji Nakajima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/678,455

(22) Filed: Aug. 16, 2017

(65) Prior Publication Data

US 2017/0346452 A1  Nov. 30, 2017

Related U.S. Application Data

(63) Continuation of application No. PCT/JP2016/054211, filed on Feb. 15, 2016.

(30) Foreign Application Priority Data

Feb. 20, 2015 (JP) .................................. 2015-032084
May 15, 2015 (JP) .................................. 2015-099967

(51) Int. Cl.
| | | |
|---|---|---|
| H03F 3/191 | (2006.01) | |
| H03F 1/56 | (2006.01) | |
| H03H 7/075 | (2006.01) | |
| H03H 7/38 | (2006.01) | |
| H03F 3/195 | (2006.01) | |
| H03F 3/21 | (2006.01) | |
| H03F 3/24 | (2006.01) | |

(52) U.S. Cl.
CPC ............. *H03F 1/565* (2013.01); *H03F 3/195* (2013.01); *H03F 3/211* (2013.01); *H03F 3/245* (2013.01);
(Continued)

(58) Field of Classification Search
CPC ........................................................ H03F 3/191
(Continued)

(56) References Cited

U.S. PATENT DOCUMENTS 6,496,072 B2 * 12/2002 Cho ..................... H03G 1/0088
                                                      330/284
7,812,687 B2 * 10/2010 Furutani .................. H04B 1/44
                                                      333/103
(Continued)

FOREIGN PATENT DOCUMENTS

JP          2005-020140 A       1/2005
JP          2013-258516 A      12/2013
(Continued)

OTHER PUBLICATIONS

International Search Report issued in Application No. PCT/JP2016/054211 dated May 10, 2016.
(Continued)

*Primary Examiner* — Henry Choe
(74) *Attorney, Agent, or Firm* — Pearne & Gordon LLP

(57) ABSTRACT

A radio frequency filter includes communication bandpass filters disposed corresponding respectively to a plurality of communication bands, a switch, and a matching circuit. The switch includes a common terminal and a plurality of optionally selectable terminals, the plurality of optionally selectable terminals being individually connected to the plurality of bandpass filters in a one-to-one relation. The matching circuit is connected to the common terminal and is a common matching circuit to the plurality of communication bandpass filters. The plurality of communication bandpass filters are set such that filter characteristics of a serial circuit in combination of one of the plurality of communication bandpass filters, the one being selected by the switch, and the common matching circuit are improved in comparison with filter characteristics of the selected communication (Continued)

bandpass filter with respect to the communication band corresponding to the selected communication bandpass filter.

17 Claims, 8 Drawing Sheets

(52) U.S. Cl.
CPC .............. *H03H 7/075* (2013.01); *H03H 7/38* (2013.01); *H03F 2200/111* (2013.01); *H03F 2200/165* (2013.01); *H03F 2200/222* (2013.01); *H03F 2200/387* (2013.01); *H03H 2250/00* (2013.01)

(58) Field of Classification Search
USPC .......................................... 330/302, 305, 51
See application file for complete search history.

(56) References Cited

U.S. PATENT DOCUMENTS

| | | | | |
|---|---|---|---|---|
| 8,629,724 | B2* | 1/2014 | Kim | H03F 1/3205 |
| | | | | 330/136 |
| 9,166,285 | B2* | 10/2015 | Uejima | H01Q 1/50 |
| 9,473,091 | B2* | 10/2016 | Hassan | H03F 1/223 |
| 9,866,265 | B2* | 1/2018 | Saji | H04B 1/48 |
| 2005/0037800 | A1* | 2/2005 | Shih | H04B 1/005 |
| | | | | 455/550.1 |
| 2009/0243703 | A1 | 10/2009 | Furutani | |
| 2011/0260806 | A1* | 10/2011 | Takeuchi | H03H 7/38 |
| | | | | 333/103 |
| 2013/0328640 | A1 | 12/2013 | Tsutsumi | |
| 2014/0062614 | A1 | 3/2014 | Park | |
| 2014/0308906 | A1 | 10/2014 | Saji | |

FOREIGN PATENT DOCUMENTS

| | | |
|---|---|---|
| JP | 2014-050098 A | 3/2014 |
| JP | 2014-207517 A | 10/2014 |
| WO | 2008/075551 A1 | 6/2008 |
| WO | 2010/053131 A1 | 5/2010 |

OTHER PUBLICATIONS

Written Opinion issued in Application No. PCT/JP2016/054211 dated May 10, 2016.

* cited by examiner

RADIO FREQUENCY FILTER, RADIO FREQUENCY FRONT-END CIRCUIT, COMMUNICATION DEVICE, AND DESIGN METHOD FOR RADIO FREQUENCY FILTER

This is a continuation of International Application No. PCT/JP2016/054211 filed on Feb. 15, 2016 which claims priority from Japanese Patent Application Nos. 2015-099967 filed on May 15, 2015 and No. 2015-032084 filed on Feb. 20, 2015. The contents of these applications are incorporated herein by reference in their entireties.

BACKGROUND

Technical Field

The present disclosure relates to a radio frequency filter that performs filter processing while changing over radio frequency signals in a plurality of communication bands, a radio frequency front-end circuit, and a design method for the radio frequency filter.

At present, with increasing diversity of communication bands, various wireless communication devices are put into practice each of which transmits and receives radio frequency signals in a plurality of communication bands by employing one antenna. The plurality of communication bands are different from one another in frequency band to be used (i.e., use frequency band). Accordingly, the wireless communication device includes a filter for each of the communication bands.

A device disclosed in Patent Document 1, for example, includes a plurality of filters in one-to-one relation to communication bands. The filters are selectively connected to an antenna through a switch.

FIG. 15 is a block diagram illustrating a configuration of a related-art radio frequency filter. As illustrated in FIG. 15, the related-art radio frequency filter 10P includes a plurality of bandpass filters 21P to 26P, switches 31 and 32, and individual specific matching circuits 411P to 416P and 421P to 426P.

The specific matching circuit 411P is connected to one end of the bandpass filter 21P, and the specific matching circuit 421P is connected to the other end of the bandpass filter 21P. The bandpass filters 22P to 26P and the specific matching circuits 412P to 416P and 422P to 426P are also connected in similar relations.

The switch 31 selectively connects one of the specific matching circuits 411P to 416P to a first input-output terminal P1. The switch 32 selectively connects one of the specific matching circuits 421P to 426P to a second input-output terminal P2.

In the bandpass filter 21P, element values of circuit elements constituting the filter are determined such that a use frequency band of a communication band Band A falls within a specific pass band. Similarly, in each of the bandpass filters 22P to 26P, element values of circuit elements constituting the relevant filter are set such that a use frequency band of a communication band BAND A in a corresponding communication band to be transferred falls within a specific pass band.

In the specific matching circuit 411P, element values of circuit elements constituting the matching circuit are set such that an impedance when looking at the bandpass filter 21P from the side including the input-output terminal P1 is a predetermined impedance (e.g., 50Ω) in the use frequency band of the communication band Band A. In each of the other specific matching circuits 412P to 416P, element values of circuit elements are set in a similar manner.

In the specific matching circuit 421P, element values of circuit elements constituting the matching circuit are set such that an impedance when looking at the bandpass filter 21P from the side including the input-output terminal P2 is a predetermined impedance (e.g., 50Ω) in the use frequency band of the communication band Band A. In each of the other specific matching circuits 422P to 426P, element values of circuit elements are set in a similar manner.

Thus, in the related-art radio frequency filter 10P, the specific matching circuits 411P to 416P and 421P to 426P are disposed in a one-to-one relation to the bandpass filters 21P to 26P.

Patent Document 1: Japanese Unexamined Patent Application Publication No. 2014-50098

BRIEF SUMMARY

In the related-art radio frequency filter 10P, however, when the number of bandpass filters increases with an increase in the number of communication bands to be processed by the radio frequency filter 10P, the number of specific matching circuits also increases corresponding to the number of bandpass filters. Accordingly, a circuit of the radio frequency filter 10P is complicated, and a size of the circuit is increased.

The present disclosure provides a radio frequency filter which can realize size reduction with a simple configuration without necessarily increasing the number of matching circuits even when the number of communication bands increases, and which has good filter characteristics in each of communication bands.

The present disclosure provides a radio frequency filter including a plurality of communication bandpass filters disposed corresponding respectively to different communication bands, a switch, and a matching circuit. The switch includes a common terminal and a plurality of optionally selectable terminals, the plurality of optionally selectable terminals being individually connected to the plurality of communication bandpass filters in a one-to-one relation. The matching circuit is connected to the common terminal, and is a common matching circuit to the plurality of communication bandpass filters.

The plurality of communication bandpass filters are set such that filter characteristics of a serial circuit in combination of one of the plurality of communication bandpass filters, the one being selected by the switch, and the common matching circuit are improved in comparison with filter characteristics of the selected communication bandpass filter with respect to the communication band corresponding to the selected communication bandpass filter.

With the above features, optimum filter characteristics can be obtained in each of the communication bands without necessarily disposing the individual matching circuits in a one-to-one relation to the plurality of communication bandpass filters.

The radio frequency filter according to the present disclosure may include a switch including a common terminal and a plurality of optionally selectable terminals, a matching circuit connected to the common terminal, and a plurality of communication bandpass filters individually connected to the plurality of optionally selectable terminals in a one-to-one relation and corresponding to different communication bands, each of the plurality of communication bandpass filters exhibiting filter characteristics in a circuit in which the relevant communication bandpass filter is connected to the matching circuit by the switch, better than filter characteristics of the relevant communication bandpass filter alone.

With the above features, optimum filter characteristics in each of the communication bands can be obtained without necessarily disposing the individual matching circuits in a one-to-one relation to the plurality of communication bandpass filters.

In the radio frequency filter according to the present disclosure, the matching circuit may include a trap filter.

With the above feature, attenuation in a desired frequency can be increased while objective bandpass characteristics are obtained as objective filter characteristics.

In the radio frequency filter according to the present disclosure, the matching circuit may include a switch disposed in the matching circuit and selecting connection of the trap filter.

With the above feature, a configuration using the trap filter or a configuration not using the trap filter can be selected depending on the communication band.

In the radio frequency filter according to the present disclosure, the trap filter may include a variable capacitor.

With the above feature, an attenuation pole frequency can be adjusted.

In the radio frequency filter according to the present disclosure, the trap filter may be connected between the common terminal and a ground.

With the above feature, since the variable capacitor is not connected in series to the bandpass filter, a transmission loss caused by the variable capacitor can be reduced.

In the radio frequency filter according to the present disclosure, the matching circuit may include an inductor and a capacitor that are selectively connected in series to a transfer line interconnecting the common terminal and an external circuit.

With the above feature, further adjustment can be made on the filter characteristics of the radio frequency filter.

The radio frequency filter according to the present disclosure may be constituted as follows. The radio frequency filter further includes a bypass circuit formed of a reactance circuit not having a function of filtering process, which is provided by the plurality of communication bandpass filters. The switch selects and connects one among the bypass circuit and the plurality of communication bandpass filters.

With the above features, a transfer path not passing through the bandpass filter can be selected. For instance, in a communication band in which the filtering process is not needed and transfer can be performed with a lower loss, lower-loss characteristics can be realized by selecting the bypass circuit.

In the radio frequency filter according to the present disclosure, the matching circuit may include an inductor connected to the common terminal and to an external connection terminal, and a capacitor having one end connected to the inductor and the other end directly or indirectly connected to a ground potential.

With the above feature, the matching circuit is implemented using a simple circuit configuration as a basic configuration. In addition, the function of a low pass filter is further obtained with the above feature.

In the radio frequency filter according to the present disclosure, the matching circuit may include a capacitor connected between the common terminal and an external connection terminal, and an inductor having one end connected to the capacitor and the other end directly or indirectly connected to a ground potential.

With the above feature, the matching circuit is implemented using a simple circuit configuration as a basic configuration.

In the radio frequency filter according to the present disclosure, a terminal to which the matching circuit is connected is a terminal to which a reception signal received by an antenna is input.

The above feature corresponds to an embodiment in which the above-described radio frequency filter is disposed in a transfer path of the reception signal. Since the reception signal has lower signal intensity than a transmission signal, the configuration of the radio frequency filter is more effectively useful.

The present disclosure further provides a radio frequency front-end circuit including a power amplifier, and a transmission-side filter that executes a filtering process on a transmission signal after having been amplified by the power amplifier, wherein the above-described radio frequency filter is used as the transmission-side filter.

With the above features, the radio frequency front-end circuit having a small size can be realized while filter characteristics optimum for the transmission signal in each communication band are obtained.

The radio frequency front-end circuit according to the present disclosure may further include a demultiplexing circuit connected between the transmission-side filter and the antenna.

With the above feature, the size of the radio frequency front-end circuit including the demultiplexing circuit can be reduced.

In the radio frequency front-end circuit according to the present disclosure, the transmission-side filter is connected between adjacent two among multiple stages of the power amplifiers.

With the above feature, the above-described radio frequency filter is utilized as an inter-stage filter among the plurality of power amplifiers. Accordingly, the radio frequency front-end circuit executing the filtering process of the transmission signal with a low loss and high accuracy can be obtained.

The radio frequency front-end circuit according to the present disclosure may further include an RFIC that outputs the transmission signal to the power amplifier.

With the above feature, the size of the radio frequency front-end circuit including the RFIC can be reduced.

The present disclosure further provides a communication device including the above-described radio frequency front-end circuit, and a BBIC connected to the RFIC.

With the above feature, the size of the communication device can be reduced.

According to the present disclosure, size reduction can be realized with a simple configuration without necessarily increasing the number of matching circuits even when the number of communication bands increases, and the radio frequency filter having good filter characteristics in the plurality of communication bands can be obtained.

DETAILED DESCRIPTION

Figure 1:
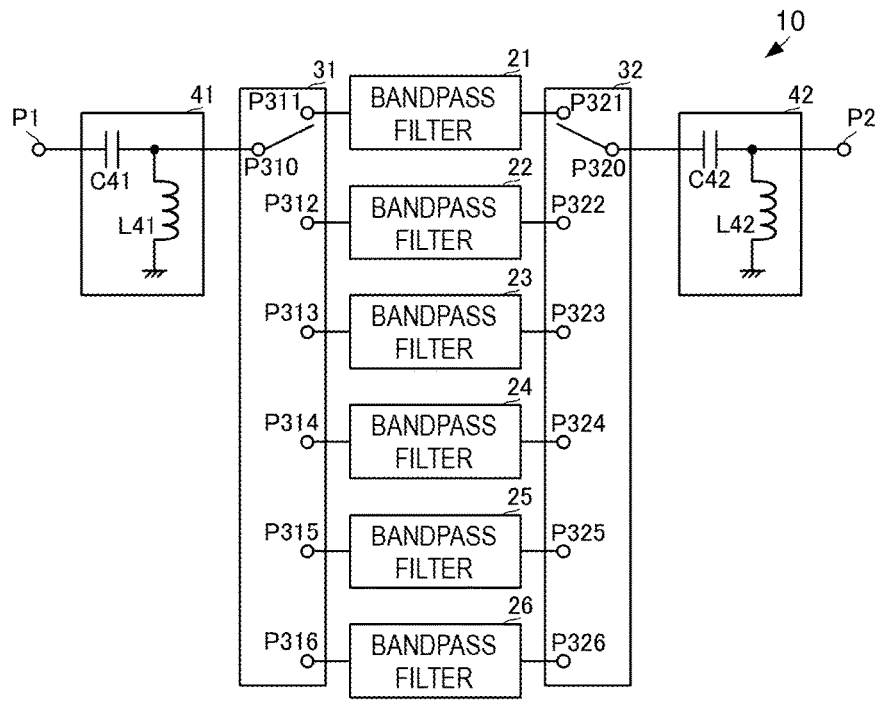
FIG. 1 is a circuit diagram of a radio frequency filter according to a first embodiment of the present disclosure.

A radio frequency filter and a radio frequency front-end circuit according to a first embodiment of the present disclosure will be described below with reference to the drawings. FIG. 1 is a circuit diagram of the radio frequency filter according to the first embodiment of the present disclosure.

A communication band Band A, for example, in the following description stands for an appropriate one (i.e., a communication band for which the configuration of this embodiment is required) among the communication bands specified in the 3GPP standards, etc. In the case of Low bands in the 3GPP standards, Band 12, 13, 28A, 28B, 20, 27, 26, 8, and so on are optionally used.

The radio frequency filter 10 includes a plurality of bandpass filters 21 to 26, switches 31 and 32, matching circuits 41 and 42, a first input-output terminal P1, and a second input-output terminal P2.

The bandpass filters 21 to 26 execute filtering processes on radio frequency signals in communication bands different from one another. Thus, the bandpass filters 21 to 26 are different in setting of bandpass characteristics and attenuation characteristics. The bandpass filters 21 to 26 are each implemented by appropriately combining filter component elements such as a SAW resonator, an inductor, and a capacitor. A practical method of setting the bandpass characteristics and the attenuation characteristics of the bandpass filters 21 to 26 will be described later.

The switch 31 includes a common terminal P310 and optionally selectable terminals P311 to P316. The switch 31 selectively connects one of the optionally selectable terminals P311 to P316 to the common terminal P310 in accordance with a switch control signal applied from the outside.

The optionally selectable terminal P311 is connected to the bandpass filter 21. Similarly, the optionally selectable terminals P312 to P316 are connected respectively to the bandpass filters 22 to 26.

The common terminal P310 is connected to the matching circuit 41. The matching circuit 41 is connected to the first input-output terminal P1.

The switch 32 includes a common terminal P320 and optionally selectable terminals P321 to P326. The switch 32 selectively connects one of the optionally selectable terminals P321 to P326 to the common terminal P320 in accordance with a switch control signal applied from the outside.

The optionally selectable terminal P321 is connected to the bandpass filter 21. Similarly, the optionally selectable terminals P322 to P326 are connected respectively to the bandpass filters 22 to 26.

The common terminal P320 is connected to the matching circuit 42. The matching circuit 42 is connected to the second input-output terminal P2.

The matching circuit 41 includes a capacitor C41 and an inductor L41. The capacitor C41 is connected between the first input-output terminal P1 and the common terminal P310. The inductor L41 is connected between a transfer line, which interconnects the capacitor C41 and the common terminal P310, and the ground.

The matching circuit 42 includes a capacitor C42 and an inductor L42. The capacitor C42 is connected between the second input-output terminal P2 and the common terminal P320. The inductor L42 is connected between a transfer line, which interconnects the capacitor C42 and the second input-output terminal P2, and the ground.

In the radio frequency filter 10 having the above-described configuration, when a radio frequency signal in the communication band Band A is transferred and subjected to the filtering process, the common terminal P310 and the optionally selectable terminal P311 are connected to each other, and the common terminal P320 and the optionally selectable terminal P321 are connected to each other. Furthermore, in the radio frequency filter 10, when a radio frequency signal in a communication band Band B is transferred and subjected to the filtering process, the common terminal P310 and the optionally selectable terminal P312 are connected to each other, and the common terminal P320 and the optionally selectable terminal P322 are connected to each other. Similarly, when a radio frequency signal in each of other communication bands is transferred and subjected to the filtering process, the switches 31 and 32 are operated to change over connections such that the corresponding one bandpass filter is connected to the common terminals P310 and P320.

With the configuration described above, the radio frequency signal input from the first input-output terminal P1 is output from the second input-output terminal P2 through the matching circuit 41, the switch 31, selected one of the bandpass filters 21 to 26, the switch 32, and the matching circuit 42. On that occasion, the radio frequency signal is subjected to the filtering process corresponding to the selected bandpass filter, and is then output from the second input-output terminal P2.

In the radio frequency filter 10, therefore, when the radio frequency signal in any of the communication bands is to be transferred, the radio frequency signal is transferred through the matching circuits 41 and 42. Stated in another way, the matching circuits 41 and 42 are common to all the communication bands in which the radio frequency signals are transferred through the radio frequency filter 10 and subjected to the filtering process. Thus, since the matching circuit is not disposed for each of the bandpass filters, the radio frequency filter 10 can be realized with a simple circuit configuration in a small size.

In the radio frequency filter 10, the matching circuits 41 and 42 and the bandpass filters 21 to 26 are set as follows.

Figure 2:
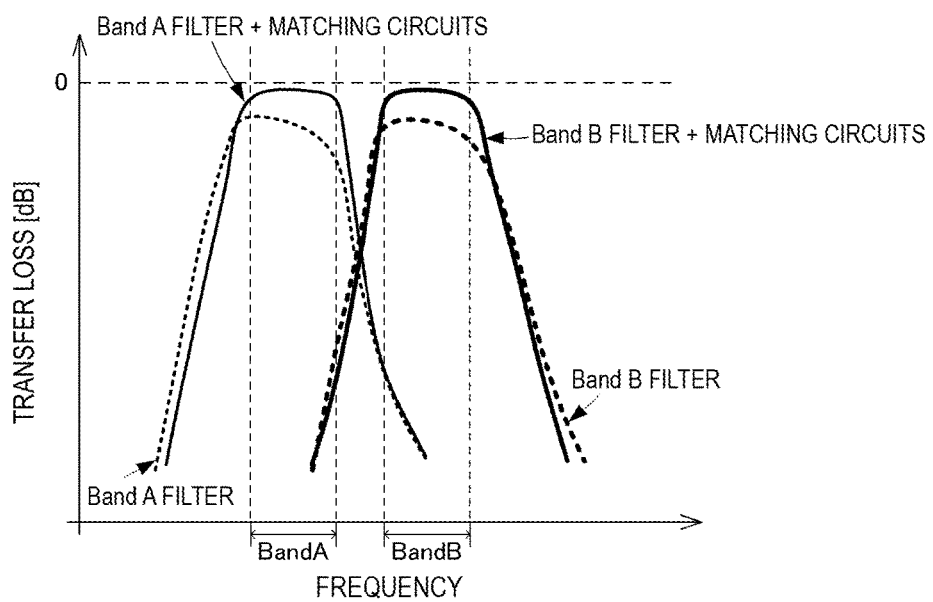
FIG. 2 is a graph depicting rough frequency characteristics of transfer losses, the graph being referenced to explain the concept for setting filter characteristics of the radio frequency filter according to the first embodiment of the present disclosure.

FIG. 2 is a graph depicting rough frequency characteristics of transfer losses, the graph being referenced to explain the concept for setting filter characteristics of the radio frequency filter according to the first embodiment of the present disclosure. In FIG. 2, a dotted line represents frequency characteristics of the bandpass filter alone, and a solid line represents frequency characteristics of a circuit in combination of the bandpass filter and the matching circuits.

As depicted in FIG. 2, with respect to the bandpass filter alone for which the communication band subjected to the filtering process is set to the communication band Band A (i.e., with respect to a Band A filter alone in FIG. 2), the filter is set such that some transfer loss generates in a pass band of the communication band Band A. However, the transfer loss in the pass band of the communication band Band A is improved in a serial circuit in combination of the matching circuits 41 and 42, i.e., the common matching circuits, and the bandpass filter of the Band A.

Similarly, as depicted in FIG. 2, with respect to the bandpass filter alone for which the communication band subjected to the filtering process is set to the communication band Band B (i.e., with respect to a Band B filter alone in FIG. 2), the filter is set such that some transfer loss generates in a pass band of the communication band Band B. However, the transfer loss in the pass band of the communication band Band B is improved in a serial circuit in combination of the matching circuits 41 and 42, i.e., the common matching circuits, and the bandpass filter alone of the Band B.

This is based on such intentional setting that, in the bandpass filter alone, the filter characteristics are not optimum in the communication band subjected to the filtering process, while the filter characteristics are optimum in the serial circuit of the common matching circuits and the bandpass filter.

In other words, the filter characteristics of each bandpass filter are deviated from optimum filter characteristics (i.e., objective filter characteristics of the radio frequency filter 10) depending on impedances of the common matching circuits. With the above-described setting, it is easier to realize the optimum filter characteristics with the combination of the common matching circuits and the bandpass filter alone in the objective communication band by adjusting the filter characteristics of the bandpass filter alone in accordance with impedance characteristics of the common matching circuits.

Accordingly, good filter characteristics can be realized with the configuration of this embodiment even when the common matching circuits are used for a plurality of communication bands, i.e., a plurality of bandpass filters.

Furthermore, since the filter characteristics of the plurality of bandpass filters are adjusted with respect to the impedances of the matching circuits, the filter characteristics of the radio frequency filter 10 can be made optimum in spite of simplification of the matching circuits. Accordingly, the configuration of the matching circuits can be further simplified and reduced in size.

Figure 3:
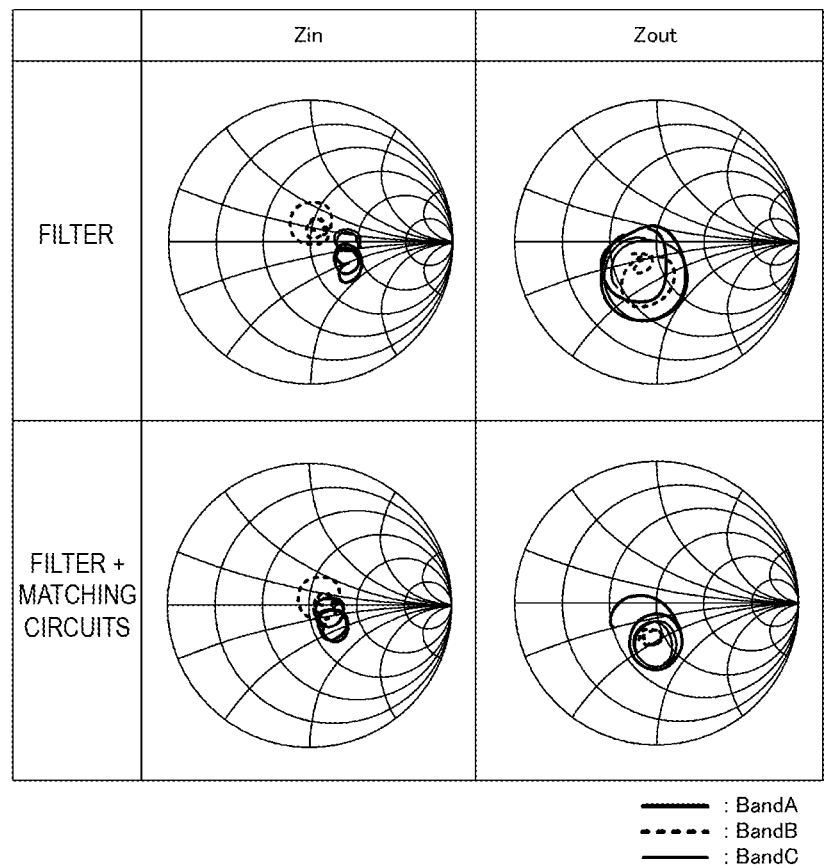
FIG. 3 illustrates a Smith chart representing Zin and Zout of a bandpass filter alone and a serial circuit of a bandpass filter and matching circuits in the radio frequency filter according to the first embodiment of the present disclosure.

FIG. 3 illustrates a Smith chart representing Zin and Zout of the bandpass filter alone and the serial circuit of the bandpass filter and the matching circuits in the radio frequency filter according to the first embodiment of the present disclosure. Zin denotes an impedance when looking at the bandpass filter from the side including the first input-output terminal P1, and Zout denotes an impedance when looking at the bandpass filter from the side including the second input-output terminal P2. An optimum impedance of Zin is set to 50[Ω], and an optimum impedance of Zout is set to an impedance (e.g., about 30[Ω]) slightly smaller than 50[Ω]. In FIG. 3, a fat solid line represents the impedance characteristics in Band A, a fat dotted line represents the impedance characteristics in Band B, and a thin dotted line represents the impedance characteristics in Band C.

As illustrated in FIG. 3, looking at the bandpass filter alone in the configuration of this embodiment, Zin and Zout are both wholly deviated from the optimum impedance (50Ω), and an impedance trace (i.e., a change of impedance depending on frequency) is large. Looking at the serial circuit in combination of the bandpass filter and the matching circuits in the configuration of this embodiment, however, Zin and Zout are close to the optimum impedance (50Ω), and an impedance locus (i.e., a change of impedance depending on frequency) is small.

It is also understood from FIG. 3 that, with the configuration of this embodiment, the optimum filtering process can be performed on each of the radio frequency signals in the individual communication bands by adjusting the filter characteristics of the corresponding bandpass filter even when the common matching circuits are used.

Figure 4:
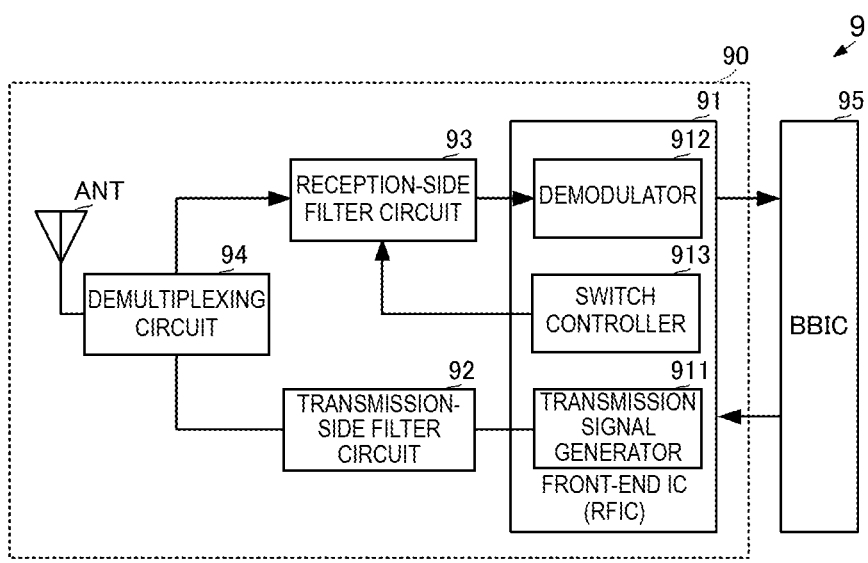
FIG. 4 is a circuit diagram of a radio frequency front-end circuit and a communication device according to the first embodiment of the present disclosure.

The radio frequency filter 10 having the above-described configuration can be applied, for example, to a radio frequency front-end circuit and a communication device each described below. FIG. 4 is a circuit diagram of a radio frequency front-end circuit and a communication device according to the first embodiment of the present disclosure.

The radio frequency front-end circuit 90 includes a front-end IC 91 that is an RFIC, a transmission-side filter circuit 92, a reception-side filter circuit 93, and a demultiplexing circuit 94. The front-end IC 91 includes a transmission signal generator 911, a demodulator 912, and a switch controller 913. The transmission signal generator 911 is connected to the transmission-side filter circuit 92. The transmission-side filter circuit 92 is connected to the demultiplexing circuit 94. The demultiplexing circuit 94 is connected to an antenna ANT. The demultiplexing circuit 94 is further connected to the reception-side filter circuit 93. The reception-side filter circuit 93 is connected to the demodulator 912. The reception-side filter circuit 93 is constituted using the above-described radio frequency filter 10. The communication device 9 includes the radio frequency front-end circuit 90 and a BBIC (base band IC) 95. The front-end IC 91 of the radio frequency front-end circuit 90 is connected to the BBIC 95.

A radio frequency signal (i.e., a transmission signal: a radio frequency signal in a transmission frequency band among communication bands in which communication is to be performed) generated in the transmission signal generator 911 is subjected to a filtering process in the transmission-side filter circuit 92, and after passing through the demultiplexing circuit 94, it is transmitted from the antenna ANT to the outside. A radio frequency signal (i.e., a reception signal: a radio frequency signal in a reception frequency band among the communication bands in which communication is to be performed) received by the antenna ANT is subjected to a filtering process in the reception-side filter circuit 93 after passing through the demultiplexing circuit 94, and is input to the demodulator 912. The switch controller 913 generates a switch control signal and executes switch control of the reception-side filter circuit 93 so as to select the bandpass filter corresponding to the communication band in which the communication is to be performed.

With the configuration described above, the reception signal in each communication band can be subjected to the filtering process and input to the demodulator 912 with a small loss. As a result, the radio frequency front-end circuit 90 having high reception sensitivity can be obtained.

The radio frequency filter 10 can be applied to other filter circuits as well, for example, the transmission-side filter circuit 92. However, the signal intensity of the reception signal is low. In particular, it is much lower than that of the transmission signal. Thus, low-loss filter characteristics are desired for the reception signal. For that reason, the effect of the above-described radio frequency filter 10 is more effective for the reception signal.

In addition, by employing the above-described radio frequency filter 10, the radio frequency front-end circuit 90 can be obtained with a simpler configuration in a smaller size.

It is to be noted that the configurations of the matching circuits 41 and 42 illustrated in FIG. 1 are just examples, and those matching circuits may be implemented in other circuit configurations using capacitors and inductors.

Figure 5:
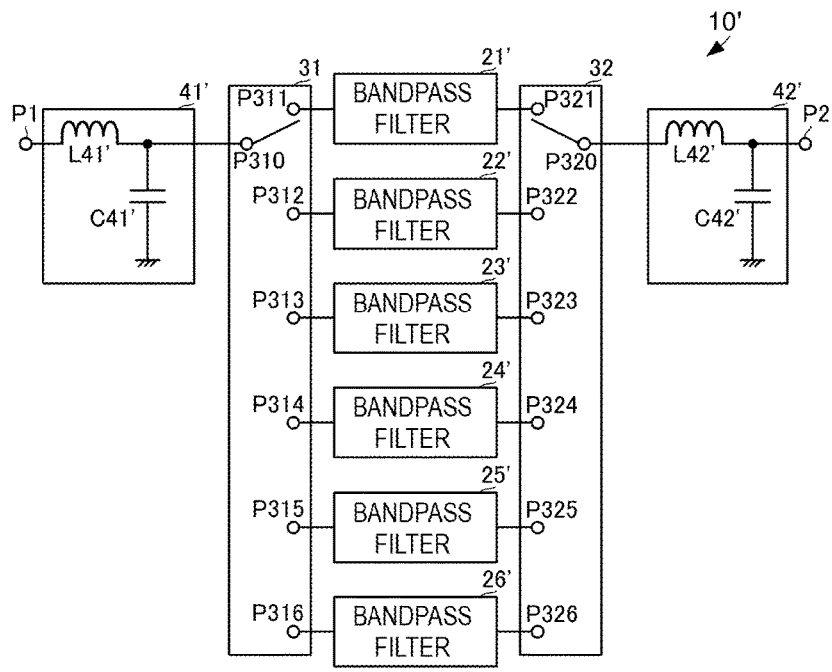
FIG. 5 is a circuit diagram of a modification of the radio frequency filter according to the first embodiment of the present disclosure.

For instance, the matching circuits may be constituted as illustrated in FIG. 5. FIG. 5 is a circuit diagram of a modification of the radio frequency filter according to the first embodiment of the present disclosure. A radio frequency filter 10' illustrated in FIG. 5 is different from the radio frequency filter 10 illustrated in FIG. 1 in configuration of matching circuits 41' and 42'. Thus, respective filter characteristics of bandpass filters 21', 22', 23', 24', 25' and 26' are set corresponding to the matching circuits 41' and 42'.

The matching circuit 41' includes an inductor L41' and a capacitor C41'. The inductor L41' is connected between the first input-output terminal P1 and the common terminal P310. The capacitor C41' is connected between a transfer line, which interconnects the inductor L41' and the common terminal P310, and the ground.

The matching circuit 42' includes an inductor L42' and a capacitor C42'. The inductor L42' is connected between the second input-output terminal P2 and the common terminal P320. The capacitor C42' is connected between a transfer line, which interconnects the inductor L42' and the second input-output terminal P2, and the ground.

With the configuration described above, the matching circuits 41' and 42' can be functioned not only as circuits to perform impedance matching, but also as low pass filters. Hence, harmonic components can be attenuated.

Figure 6:
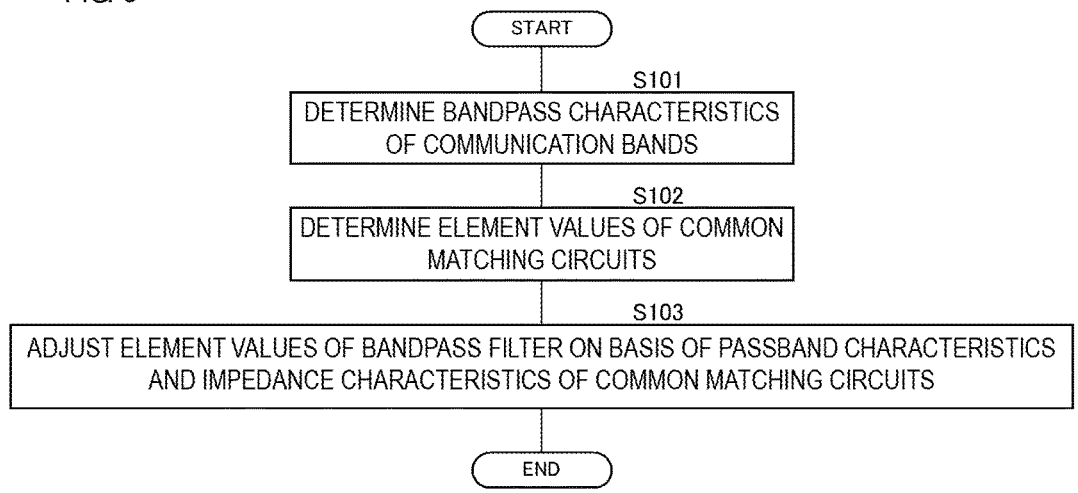
FIG. 6 is a flowchart illustrating a design method for the radio frequency filter according to the first embodiment of the present disclosure.

The above-described radio frequency filter 10 may be designed, by way of example, as follows. FIG. 6 is a flowchart illustrating a design method for the radio frequency filter according to the first embodiment of the present disclosure.

First, respective bandpass characteristics in a plurality of communication bands subjected to the filtering process in the radio frequency filter 10, e.g., allowable values of transfer losses in the pass bands, are determined (S101).

Next, element values of the common matching circuits to the plurality of communication bands are determined (S102).

Next, element values of each bandpass filter alone are adjusted on the basis of the passband characteristics and impedance characteristics of the matching circuits such that passband characteristics optimum in the corresponding communication band subjected to the filtering process are obtained in the serial circuit of the matching circuits and the bandpass filter (S103). The adjustment of the element values is performed for each of the bandpass filters, i.e., for each of the communication bands.

The radio frequency filter 10 having a small size and good filter characteristics can be obtained by, as described above, adjusting the element values of the circuit elements constituting each of the bandpass filters.

Figure 7:
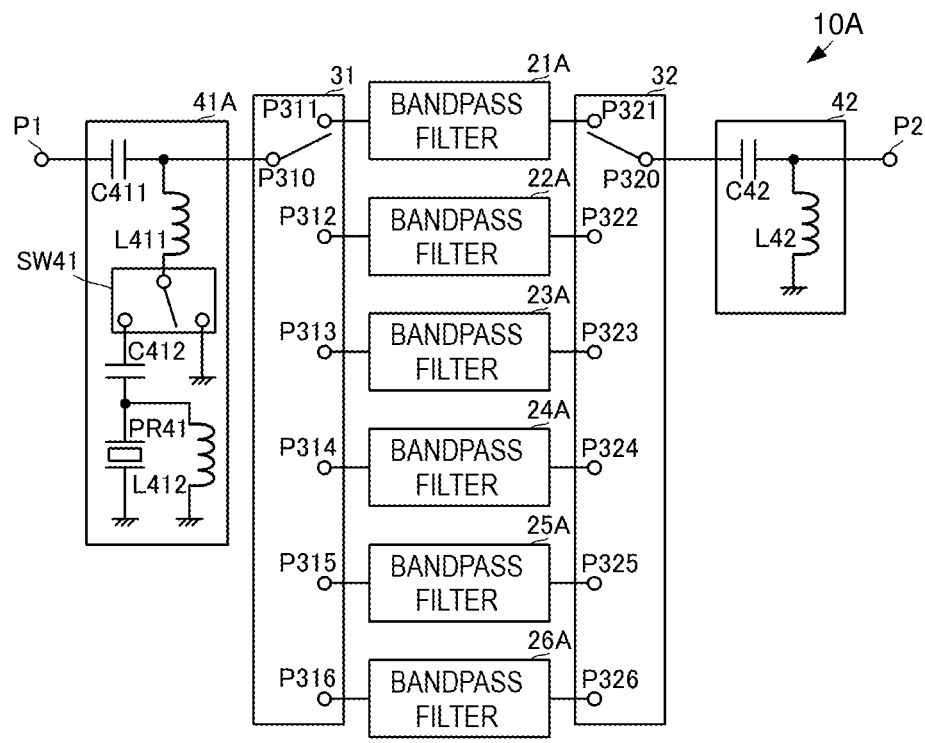
FIG. 7 is a circuit diagram of a radio frequency filter according to a second embodiment of the present disclosure.

A radio frequency filter according to a second embodiment of the present disclosure will be described below with reference to the drawings. FIG. 7 is a circuit diagram of the radio frequency filter according to the second embodiment of the present disclosure. The radio frequency filter 10A according to the second embodiment is different from the radio frequency filter 10 according to the first embodiment in configuration of a matching circuit 41A. Corresponding to such a modification, respective filter characteristics of bandpass filters 21A to 26A are set to be different from those in the first embodiment.

The matching circuit 41A includes capacitors C411 and C412, inductors L411 and L412, a piezoelectric resonator PR41, and a switch SW41.

The capacitor C411 is connected between the common terminal P310 of the switch 31 and the first input-output terminal P1. One end of the inductor L411 is connected to a transfer line that interconnects the capacitor C411 and the common terminal P310. The other end of the inductor L411 is connected to a common terminal of the switch SW41 (i.e., the switch in the matching circuit).

A first optionally selectable terminal of the switch SW41 is connected to the ground. A second optionally selectable terminal of the switch SW41 is connected to one end of the capacitor C412.

The other end of the capacitor C412 is connected to one end of the piezoelectric resonator PR41 and to one end of the inductor L412. The other end of the piezoelectric resonator PR41 and the other end of the inductor L412 are connected to the ground. In other words, the other end of the capacitor C412 is connected to the ground through a parallel circuit of the piezoelectric resonator PR41 and the inductor L412. A circuit constituted by the capacitor C412, the piezoelectric resonator PR41, and the inductor L412 functions as a trap filter.

With changeover control of the switch SW41, the matching circuit 41A is selectively operated in the form in which the inductor L411 is directly connected to the ground, or the form in which the inductor L411 is connected to the ground through the trap filter. Which one of those two forms is to be selected is determined depending on the communication band. The configuration of the trap filter may be changed as required. For instance, the trap filter may be constituted without necessarily using the capacitor C412 and the inductor L412.

Figure 8:
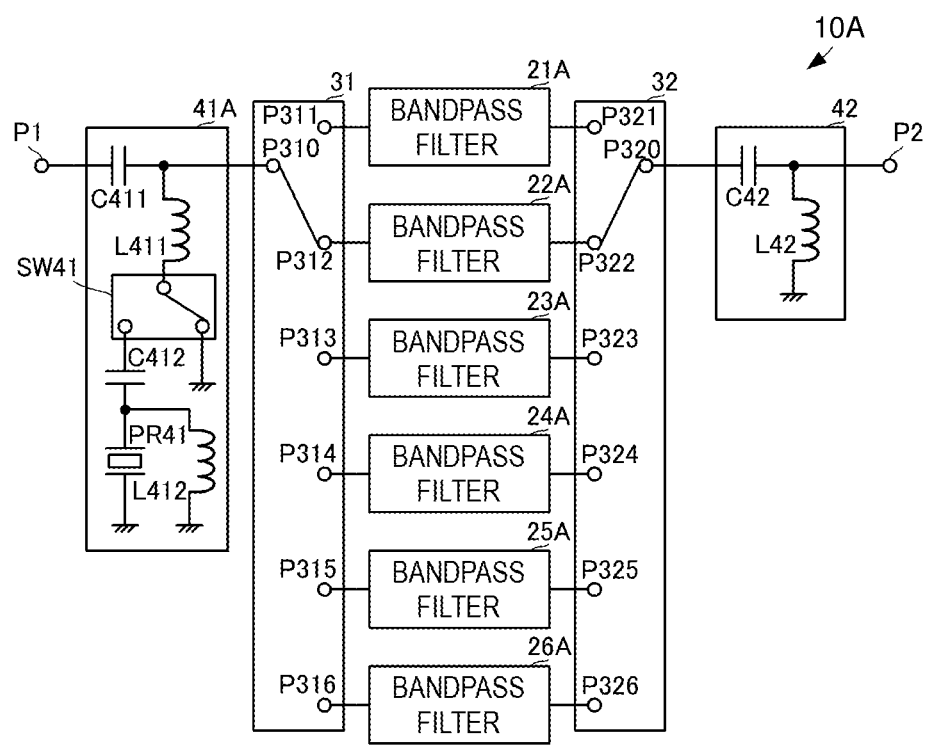
FIG. 8 is a circuit diagram illustrating a first connection configuration in the radio frequency filter according to the second embodiment of the present disclosure.

FIG. 8 is a circuit diagram illustrating a first connection configuration in the radio frequency filter according to the second embodiment of the present disclosure. In FIG. 8, the inductor L411 is connected to the ground by the switch 41. Moreover, the bandpass filter 22A is selected by the switches 31 and 32.

In the above-described first connection configuration, filter characteristics of the bandpass filter 22A alone are set on the basis of impedance characteristics of the matching circuit 41A that is constituted by the capacitor C411 and the inductor L411.

Figure 9:
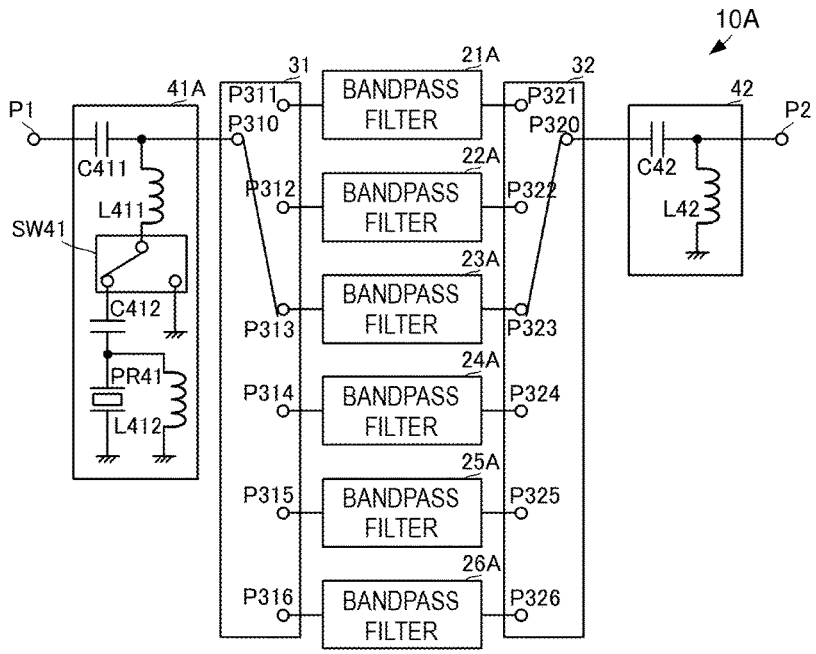
FIG. 9 is a circuit diagram illustrating a second connection configuration in the radio frequency filter according to the second embodiment of the present disclosure.

FIG. 9 is a circuit diagram illustrating a second connection configuration in the radio frequency filter according to the second embodiment of the present disclosure. In FIG. 9, the inductor L41 is connected to the ground by the switch 31 through the trap filter. Moreover, the bandpass filter 23A is selected by the switches 31 and 32.

In the above-described second connection configuration, filter characteristics of the bandpass filter 23A alone are set on the basis of impedance characteristics of the matching circuit 41A that is constituted by the capacitor C411, the inductor L411, and the trap filter.

Figure 10:
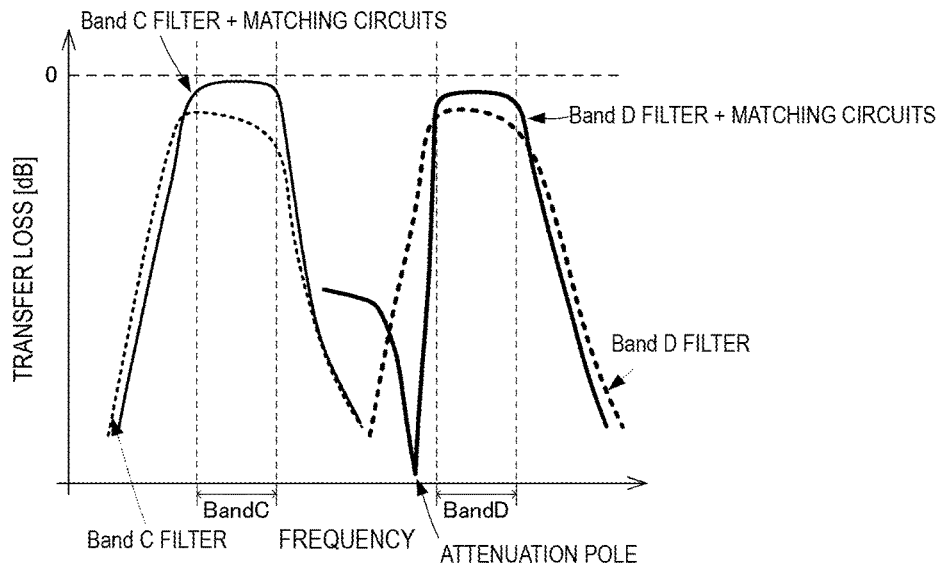
FIG. 10 is a graph depicting rough frequency characteristics of transfer losses, the graph being referenced to explain the concept for setting filter characteristics of the radio frequency filter according to the second embodiment of the present disclosure.

FIG. 10 is a graph depicting rough frequency characteristics of transfer losses, the graph being referenced to explain the concept for setting filter characteristics of the radio frequency filter according to the second embodiment of the present disclosure. In FIG. 10, a dotted line represents frequency characteristics of the bandpass filter alone, and a solid line represents frequency characteristics of a circuit in combination of the bandpass filter and the matching circuits.

As depicted in FIG. 10, in the case of the first connection configuration, with respect to the bandpass filter 22A alone for which the communication band subjected to the filtering process is set to a communication band Band C (i.e., with respect to a Band C filter alone in FIG. 10), the bandpass filter is set such that some transfer loss generates in a pass band of the communication band Band C. However, the transfer loss in the pass band of the communication band Band C is improved in a serial circuit in combination of the matching circuit 41A and the bandpass filter 22A in Band C.

As depicted in FIG. 10, in the case of the second connection configuration, with respect to the bandpass filter 23A alone for which the communication band subjected to the filtering process is set to a communication band Band D (i.e., with respect to a Band D filter alone in FIG. 10), the bandpass filter is set such that some transfer loss generates in a pass band of the communication band Band D. However, the transfer loss in the pass band of the communication band Band D is improved in a serial circuit in combination of the matching circuit 41A and the bandpass filter 23A in Band D. In addition, the matching circuit 41A in the second connection configuration includes the trap filter. Accordingly, as depicted in FIG. 10, an attenuation pole can be generated near the pass band of the communication band Band D. As a result, a radio frequency signal near that pass band (i.e., an undesired frequency component) can be attenuated to a large extent. Hence only the objective radio frequency signal can be transferred with a low loss and the other undesired frequency component can be attenuated, even when a use frequency band in another communication band exists near a use frequency band in the communication band Band D, or even when a transmission frequency band and a reception frequency band in the communication band Band D are close to each other.

Though not described in detail, in the other bandpass filters 21A and 24A to 26A of the radio frequency filter 10A according to this embodiment, filter characteristics of each bandpass filter alone are also set depending on the connection form of the matching circuit 41A, which is connected to the relevant bandpass filter, as in the bandpass filters 22A and 23A.

Figure 11:
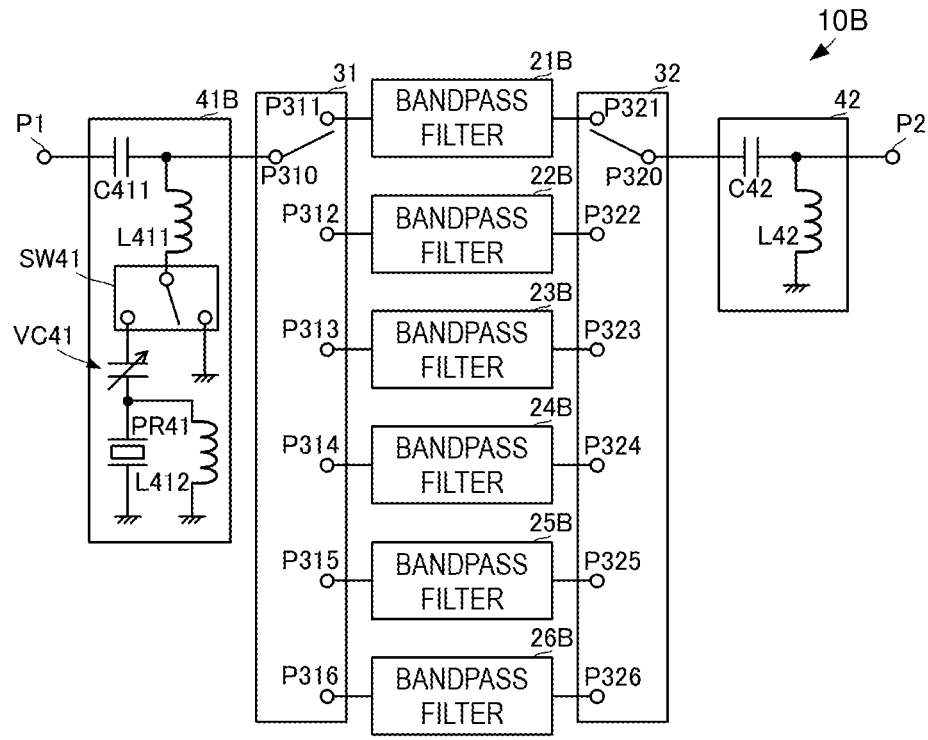
FIG. 11 is a circuit diagram of a radio frequency filter according to a third embodiment of the present disclosure.

A radio frequency filter according to a third embodiment of the present disclosure will be described below with reference to the drawing. FIG. 11 is a circuit diagram of the radio frequency filter according to the third embodiment of the present disclosure.

The radio frequency filter 10B according to the third embodiment is different from the radio frequency filter 10A according to the second embodiment in configuration of a matching circuit 41B. Corresponding to such a modification, settings of bandpass filters 21B to 26B are different from those in the second embodiment.

The matching circuit 41B is constituted by replacing the capacitor C412 of the matching circuit 41A with a variable capacitor VC41. With such a configuration, an attenuation pole frequency of the trap filter can be changed. In other words, the attenuation pole frequency can be adjusted for each of the communication bands.

The radio frequency filter 10B having even better filter characteristics can be realized with the configuration described above.

In the radio frequency filter 10B according to the third embodiment and the radio frequency filter 10A according to the second embodiment, the trap filter is connected between the transfer line, which interconnects the first input-output terminal P1 and the switch 31, and the ground. As an alternative, the trap filter may be disposed in the transfer line; namely, the trap filter may be connected between the first input-output terminal P1 and the switch 31. In the radio frequency filter 10B according to the third embodiment (this embodiment), however, the trap filter is connected between the transfer line, which interconnects the first input-output terminal P1 and the switch 31, and the ground.

In the configuration described above, the variable capacitor VC41 is not connected between the first input-output terminal P1 and the switch 31. Therefore, a loss caused by the variable capacitor VC41 can be reduced, and the radio frequency filter 10B with a lower loss can be obtained.

Figure 12:
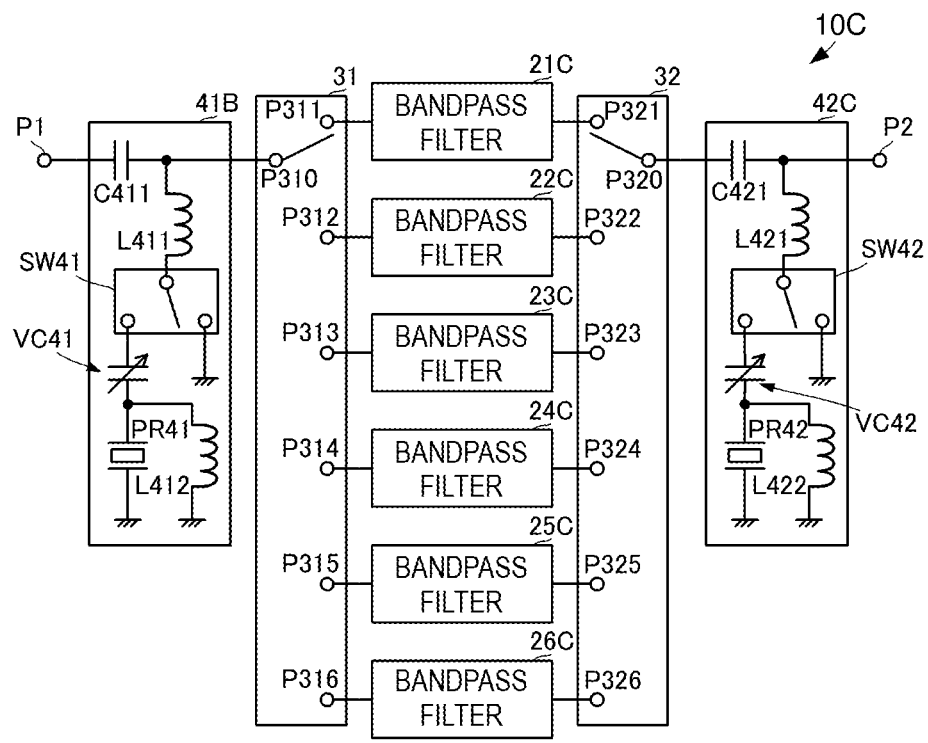
FIG. 12 is a circuit diagram of a radio frequency filter according to a fourth embodiment of the present disclosure.

A radio frequency filter according to a fourth embodiment of the present disclosure will be described below with reference to the drawing. FIG. 12 is a circuit diagram of the radio frequency filter according to the fourth embodiment of the present disclosure.

The radio frequency filter 10C according to the fourth embodiment is different from the radio frequency filter 10B according to the third embodiment in configuration of a matching circuit 42C. Corresponding to such a modification, settings of bandpass filters 21C to 26C are different from those in the third embodiment.

The matching circuit 42C includes a capacitor C421, inductors L421 and L422, a piezoelectric resonator PR42, a switch SW42, and a variable capacitor VC42.

The capacitor C421 is connected between the common terminal P320 of the switch 32 and the second input-output terminal P2. One end of the inductor L421 is connected to a transfer line that interconnects the capacitor C421 and the second input-output terminal P2. The other end of the inductor L421 is connected to a common terminal of the switch SW42 (switch in the matching circuit).

A first optionally selectable terminal of the switch SW42 is connected to the ground. A second optionally selectable terminal of the switch SW42 is connected to one end of the variable capacitor VC42.

The other end of the variable capacitor VC42 is connected to one end of the piezoelectric resonator PR42 and to one end of the inductor L422. The other end of the piezoelectric resonator PR42 and the other end of the inductor L422 are connected to the ground. In other words, the other end of the variable capacitor VC42 is connected to the ground through a parallel circuit of the piezoelectric resonator PR42 and the inductor L422. A circuit constituted by the variable capacitor VC42, the piezoelectric resonator PR42, and the inductor L422 functions as a trap filter capable of adjusting the attenuation pole frequency.

With changeover control of the switch SW42, the matching circuit 42C is selectively operated in the form in which the inductor L421 is directly connected to the ground, or the form in which the inductor L421 is connected to the ground through the trap filter. Which one of those two forms is to be selected is determined depending on the communication band.

Furthermore, in each of the bandpass filters 21C to 26C, filter characteristics of the bandpass filter alone are set corresponding to the form of the matching circuit 42C connected thereto (such as the connection form of the switch SW42 and the capacitance of the variable capacitor in the trap filter).

Thus, similar advantageous effects to those in the above-described embodiments can also be obtained even when the matching circuits 41B and 42C capable of changing over the connection form are connected to both the ends of each of the bandpass filters 21C to 26C. Moreover, with the configuration of this embodiment, impedance characteristics of the radio frequency filter 10C when looked from the side including the second input-output terminal P2 can be more appropriately adjusted, and filter characteristics can be improved.

Figure 13:
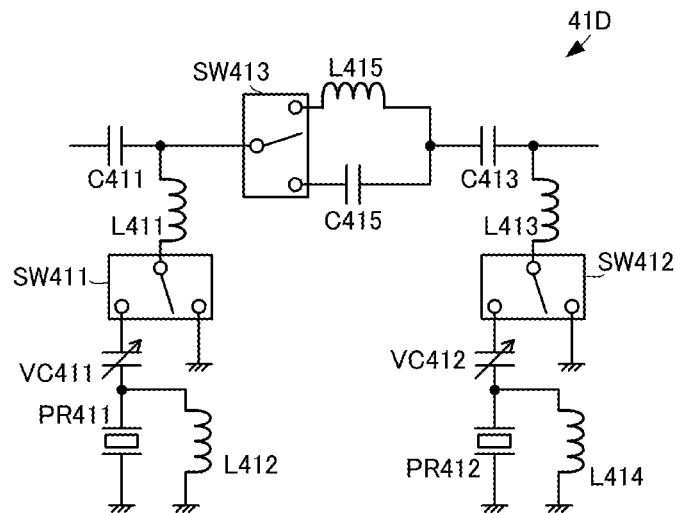
FIG. 13 is a circuit diagram of a matching circuit in a radio frequency filter according to a fifth embodiment of the present disclosure.

A radio frequency filter according to a fifth embodiment of the present disclosure will be described below with reference to the drawing. FIG. 13 is a circuit diagram of a matching circuit in the radio frequency filter according to the fifth embodiment of the present disclosure.

The radio frequency filter according to the fifth embodiment is different from the radio frequency filters according to the above embodiments in configuration of the matching circuit. Corresponding to such a modification, settings of the bandpass filters are different from those in the above embodiment.

A matching circuit 41D includes capacitors C411, C413 and C415, inductors L411, L412, L413, L414 and L415, switches SW411, SW412 and SW413, piezoelectric resonators PR411 and PR412, and variable capacitors VC411 and VC412.

The capacitor C411 is connected between the first input-output terminal P1 and the common terminal P310 of the switch 31, all of which are not illustrated in FIG. 13. One end of the inductor L411 is connected to an end of the capacitor C411 on the side opposite to the first input-output terminal P1. The other end of the inductor L411 is connected to a common terminal of the switch SW411 (switch in the matching circuit).

A first optionally selectable terminal of the switch SW411 is connected to the ground. A second optionally selectable terminal of the switch SW411 is connected to one end of the variable capacitor VC411.

The other end of the variable capacitor VC411 is connected to one end of the piezoelectric resonator PR411 and to one end of the inductor L412. The other end of the piezoelectric resonator PR411 and the other end of the inductor L412 are connected to the ground. In other words, the other end of the variable capacitor VC411 is connected to the ground through a parallel circuit of the piezoelectric resonator PR411 and the inductor L412. A circuit constituted by the variable capacitor VC411, the piezoelectric resonator PR411, and the inductor L412 functions as a first trap filter capable of adjusting the attenuation pole frequency.

The capacitor C413 is connected between the capacitor C411 and the common terminal P310 of the switch 3, the latter two being not illustrated in FIG. 13. One end of the inductor L413 is connected to an end of the capacitor C413 on the side closer to the common terminal P310. The other end of the inductor L413 is connected to a common terminal of the switch SW412 (switch in the matching circuit).

A first optionally selectable terminal of the switch SW412 is connected to the ground. A second optionally selectable terminal of the switch SW412 is connected to one end of the variable capacitor VC412.

The other end of the variable capacitor VC412 is connected to one end of the piezoelectric resonator PR412 and to one end of the inductor L414. The other end of the piezoelectric resonator PR412 and the other end of the inductor L414 are connected to the ground. In other words, the other end of the variable capacitor VC412 is connected to the ground through a parallel circuit of the piezoelectric resonator PR412 and the inductor L414. A circuit constituted by the variable capacitor VC412, the piezoelectric resonator PR412, and the inductor L414 functions as a trap filter capable of adjusting the attenuation pole frequency.

Between the capacitors C411 and C413, one of a capacitor C415 and an inductor L415 is selectively connected by a switch SW413.

As seen from the above description, the matching circuit 41D is constituted by connecting the above-described matching circuit 41B according to the third embodiment in multiple stages. Furthermore, the matching circuit 41D can select which one of characteristics of the low pass type and characteristics of the high pass type is given to the matching circuit 41D.

With the configuration described above, the radio frequency filter is adaptable for a more variety of impedance characteristics depending on combinations of the switches SW411, SW412 and SW413. In particular, even when a plurality of communication bands include, for example, communication bands different in high-low level relation between the transmission frequency band and the reception frequency band from the other communication bands, filter characteristics with low losses can be realized in all of the communication bands, which are to be subjected to the filtering process in the radio frequency filter, with the capability of selecting the characteristics of the matching circuit 41D to be the low pass type or the high pass type.

While the radio frequency filters according to the second and subsequent embodiments have been described in connection with the example in which the switch is disposed in the matching circuit to be able to select the impedance characteristics, the above-described configurations can be further applied to the case including only a trap filter. Such a modification can also provide similar advantageous effects to those in the above-described embodiments.

Figure 14:
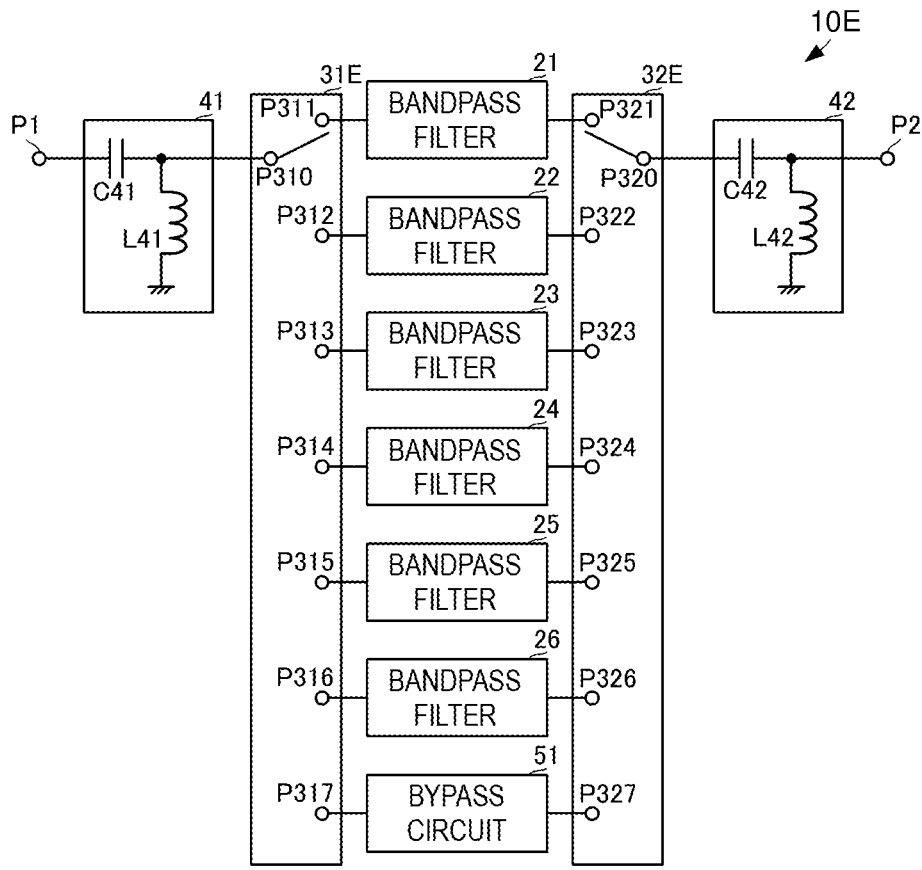
FIG. 14 is a circuit diagram of a radio frequency filter according to a sixth embodiment of the present disclosure.
Figure 15:
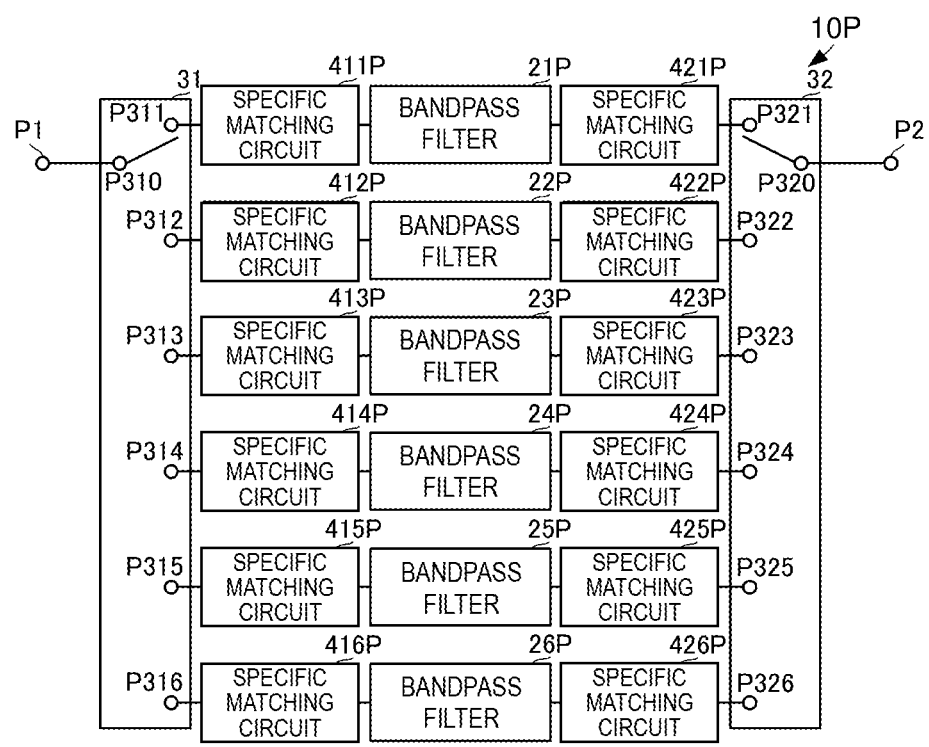
FIG. 15 is a block diagram illustrating a configuration of a related-art radio frequency filter.

A radio frequency filter according to a sixth embodiment of the present disclosure will be described below with reference to the drawing. FIG. 14 is a circuit diagram of the radio frequency filter according to the sixth embodiment of the present disclosure.

The radio frequency filter 10E according to the sixth embodiment is different from the radio frequency filter 10 according to the first embodiment in configuration of the switches 31E and 32E, and in adding a bypass circuit 51.

In the switch 31E, an optionally selectable terminal P317 is added to the switch 31 in the radio frequency filter 10 according to the first embodiment. The switch 31E selectively connects any one of the optionally selectable terminals P311 to P317 to the common terminal P310.

In the switch 32E, an optionally selectable terminal P327 is added to the switch 32 in the radio frequency filter 10 according to the first embodiment. The switch 32E selectively connects any one of the optionally selectable terminals P321 to P327 to the common terminal P320.

The bypass circuit 51 is connected between the optionally selectable terminal P317 of the switch 31E and the optionally selectable terminal P327 of the switch 32E.

The bypass circuit 51 is a reactance circuit having a simpler circuit configuration than the other bandpass filters 21 to 26. The bypass circuit 51 is constituted, for example, by a transfer line just interconnecting the optionally selectable terminals P317 and P327, or by a circuit in which an inductor and a capacitor are connected just one or in a few number. Thus, the bypass circuit 51 is a circuit that does not execute, unlike the other bandpass filters 21 to 26, the filtering process on a radio frequency signal to be transferred therethrough. Stated in another way, the bypass circuit 51 has a circuit configuration not attenuating radio frequency signals in a comparatively wide range of frequency bands that include the frequency band of a radio frequency signal transferred in the state where the optionally selectable terminals P317 and P327 are selected.

The reactance of the bypass circuit 51 is set such that an impedance when looking at the radio frequency filter 10E from the input-output terminal P1 is a predetermined impedance (e.g., 50[Ω]) at the frequency of the radio frequency signal transferred between the input-output terminals P1 and P2 through the bypass circuit 51. Furthermore, the reactance of the bypass circuit 51 is set such that an impedance when looking at the radio frequency filter 10E from the input-output terminal P2 is a predetermined impedance (e.g., 50[Ω]) at the frequency of the radio frequency signal transferred between the input-output terminals P1 and P2 through the bypass circuit 51.

In other words, the reactance of the bypass circuit 51 is set such that impedance matching is achieved in the circuit configuration including the matching circuits 41 and 42 between when looking at the radio frequency filter from the input-output terminal P1 and when looking at the radio frequency filter from the input-output terminal P2.

With the configuration described above, in the case of transferring a radio frequency signal that does not require the filtering process by the bandpass filter, the radio frequency signal can be transferred between the input-output terminals P1 and P2 without necessarily passing through the bandpass filter. Since the bypass circuit 51 has a simpler circuit configuration than the bandpass filters 21 to 26 as described above, a transfer loss is reduced if the impedance matching is achieved. Accordingly, transfer with a low loss can be realized for the radio frequency signal that does not require the filtering process by the bandpass filter.

When the radio frequency filter 10E is applied to a transmission circuit, for example, it can be utilized as follows. Though not illustrated, the transmission circuit includes a transmission signal amplifier circuit. The transmission signal amplifier circuit includes an initial stage amplifier and a final stage amplifier. The radio frequency filter 10E is connected between the initial stage amplifier and the final stage amplifier.

In such a configuration, with respect to a frequency band (communication band) in which noise is generated from noise characteristics of the initial stage amplifier and is amplified by the final stage amplifier, the above-mentioned IC controls the switches 31E and 32E of the radio frequency filter 10E such that a signal passes through the bandpass filter corresponding to the relevant frequency band. The frequency band (communication band) in which noise is generated from the noise characteristics of the initial stage amplifier and is amplified by the final stage amplifier implies, for example, a band in which reception band noise is larger than −150 dBm/Hz, or a band in which a transmission frequency f1 and a reception frequency f2 satisfy a relation of |f1−f2|/((f1+f2)/2)≥10%. Changing-over of the switches 31E and 32E is controlled by an IC (Integrated Circuit). The IC has the function of determining the use frequency band and the function of controlling the changing-over of the switches. The IC includes an RF (Radio Frequency) IC, a BB (Base Band) IC, a PA (Power Amplifier) control IC, an application processor, etc. As a result of such control, noise can be suppressed from being amplified and output to a subsequent circuit (e.g., the antenna side). Thus, amplification characteristics with low noise can be realized in the frequency band in which noise tends to generate.

On the other hand, with respect to a frequency band (communication band) in which noise is hardly generated from the noise characteristics of the initial stage amplifier, the above-mentioned IC controls the switches 31E and 32E of the radio frequency filter 10E such that a signal passes through the bypass circuit 51. The frequency band (communication band) in which noise is hardly generated from the noise characteristics of the initial stage amplifier implies, for example, a band in which reception band noise is not larger than −150 dBm/Hz, or a band in which the transmission frequency f1 and the reception frequency f2 satisfy a relation of |f1−f2|/((f1+f2)/2)<10%. As a result of such control, the transmission loss caused by transfer through the bandpass filter can be suppressed. Thus, amplification characteristics with high efficiency can be realized in the frequency band in which noise is not generated.

Stated in another way, a multi-band transmission signal amplifier circuit with low noise or high efficiency can be obtained by selecting the bandpass filter or the bypass circuit as appropriate.

This embodiment has been described in connection with an example in which the transmission signal amplifier circuit is constituted by the amplifiers in two stages. In another example, however, the radio frequency filter 10E may be applied to a transmission signal amplifier circuit constituted by amplifiers in three or more stages and may be connected between any two of the stages.

While this embodiment has been described in connection with an example in which the radio frequency filter 10E is applied to the transmission circuit, the radio frequency filter 10E may be employed in a reception circuit.

Furthermore, the configuration of the radio frequency filter 10E according to the sixth embodiment may be applied to the radio frequency filters according to the second to fifth embodiments as well.

REFERENCE SIGNS LIST 10, 10A, 10B, 10C, 10E, 10': radio frequency filter
21 to 26, 21A to 26A, 21B to 26B, 21C to 26C, 21' to 26': bandpass filters
31, 32, 31E, 32E: switch
41, 42, 41A, 41B, 42C, 41D, 41', 42': matching circuit
51: bypass circuit
90: radio frequency front-end circuit
91: front-end IC
92: transmission-side filter circuit
93: reception-side filter circuit
94: demultiplexing circuit
95: BBIC
911: transmission signal generator
912: demodulator
913: switch controller
9: communication device
ANT: antenna C41, C411, C412, C413, C415, C42, C421, C41', C42': capacitor
L41, L411, L412, L413, L414, L415, L42, L421, L422, L41', L42': inductor
P1: first input-output terminal
P2: second input-output terminal
P310, P320: common terminal
P311, P312, P321, P322: optionally selectable terminal
PR41, PR411, PR412, PR42: piezoelectric resonator
SW41, SW411, SW412, SW413, SW42: switch
VC41, VC411, VC412, VC42: variable capacitor

The invention claimed is:

1. A radio frequency filter comprising:
a plurality of communication bandpass filters, each having a pass band corresponding to a different communication band;
a switch having a common terminal and a plurality of selectable terminals, the plurality of selectable terminals being respectively connected to one of the plurality of bandpass filters; and
a matching circuit having a first end connected to the common terminal,
wherein:
the matching circuit is common to each of the plurality of communication bandpass filters, and
filter characteristics of each of the plurality of communication bandpass filters deviate from optimum filter characteristics depending on an impedance of the matching circuit, such that there is less signal transfer loss in the pass band when the bandpass filter is serially connected to the matching circuit than if no matching circuit were present, and in a bandpass filter alone, the filter characteristics are not optimum in a communication band subjected to a filtering process, while the filter characteristics are optimum in the serially connected matching circuit and the bandpass filter.

2. A radio frequency filter comprising:
a switch having a common terminal and a plurality of selectable terminals;
a matching circuit connected to the common terminal; and
a plurality of communication bandpass filters, each connected to a respective one of the plurality of selectable terminals and having a pass band corresponding to a different communication band,
wherein filter characteristics of each of the plurality of communication bandpass filters deviate from optimum filter characteristics depending on an impedance of the matching circuit, such that each of the plurality of communication bandpass filters exhibits better filter characteristics when connected to the matching circuit by the switch, than the communication bandpass filter alone, and in a bandpass filter alone, the filter characteristics are not optimum in a communication band subjected to a filtering process, while the filter characteristics are optimum in a serial circuit of the matching circuit and the bandpass filter.

3. The radio frequency filter according to claim 1, wherein the matching circuit comprises a trap filter.

4. The radio frequency filter according to claim 3, wherein the matching circuit comprises a switch configured to electrically connect the trap filter.

5. The radio frequency filter according to claim 3, wherein the trap filter comprises a variable capacitor.

6. The radio frequency filter according to claim 3, wherein the trap filter is connected between the common terminal and ground.

7. The radio frequency filter according to claim 1, wherein the matching circuit comprises an inductor and a capacitor that are selectively connected in series to a transfer line interconnecting the common terminal and an external circuit.

8. The radio frequency filter according to claim 1, further comprising a non-filtering bypass circuit formed of a reactance elements,
wherein the switch further includes an additional selectable terminal connected to the bypass circuit.

9. The radio frequency filter according to claim 1, wherein the matching circuit comprises:
an inductor connected to the common terminal and to an external connection terminal; and
a capacitor having one end connected to the inductor and the other end directly or indirectly connected to ground.

10. The radio frequency filter according to claim 1, wherein the matching circuit comprises:
a capacitor connected between the common terminal and an external connection terminal; and
an inductor having one end connected to the capacitor and the other end directly or indirectly connected to ground.

11. The radio frequency filter according to claim 1, wherein a second end of the matching circuit is connected to a terminal that receives a reception signal from an antenna.

12. A radio frequency front-end circuit comprising:
a power amplifier; and
the radio frequency filter according to claim 1,
wherein the radio frequency filter is configured as a transmission-side filter that executes a filtering process on a transmission signal after having been amplified by the power amplifier.

13. The radio frequency front-end circuit according to claim 12, further comprising:
a demultiplexing circuit connected between the transmission-side filter and the antenna.

14. The radio frequency front-end circuit according to claim 12,
comprising a plurality of power amplifiers configured for multiple stage amplification of the transmission signal,
wherein the transmission-side filter is connected between stages of the power amplifiers.

15. The radio frequency front-end circuit according to claim 12,
further comprising a radio frequency integrated circuit (RFIC) that outputs the transmission signal to the power amplifier.

16. A communication device comprising:
the radio frequency front-end circuit according to claim 15; and
a baseband integrated circuit (BBIC) connected to the RFIC.

17. A design method for a radio frequency filter comprising:
a plurality of communication bandpass filters with electrical components, each of the plurality of communication bandpass filters having a pass band corresponding to a different communication band;
a switch having a common terminal and a plurality of selectable terminals, the plurality of selectable terminals being respectively connected to one of the plurality of communication bandpass filters; and
a matching circuit having a first end connected to the common terminal and being common to each of the plurality of communication bandpass filters, the design method comprising steps of:
obtaining an impedance of the matching circuit in each of the plurality of communication bands; and
adjusting filter characteristics of each of the plurality of communication bandpass filters based on an impedance of the matching circuit in each of the plurality of communication bands, wherein the filter characteristics of each of the plurality of communication bandpass filters deviate from optimum filter characteristics depending on the impedance of the matching circuit, such that there is less signal transfer loss in the pass band when the bandpass filter is serially connected to the matching circuit than if no matching circuit were present, and in a bandpass filter alone, the filter characteristics are not optimum in a communication band subjected to a filtering process, while the filter characteristics are optimum in the serially connected matching circuit and the bandpass filter.

* * * * *